United States Patent [19]

Jaecklin

[11] 4,150,391
[45] Apr. 17, 1979

[54] GATE-CONTROLLED REVERSE CONDUCTING THYRISTOR

[75] Inventor: André Jaecklin, Ennetbaden, Switzerland

[73] Assignee: BBC Brown, Boveri & Company, Limited, Baden, Switzerland

[21] Appl. No.: 826,660

[22] Filed: Aug. 22, 1977

[30] Foreign Application Priority Data

Sep. 3, 1976 [CH] Switzerland .................. 11186/76

[51] Int. Cl.² ........................................ H01L 29/747
[52] U.S. Cl. .................................. 357/39; 357/38; 357/52; 357/86
[58] Field of Search .................. 357/38, 39, 52, 86, 357/20

[56] References Cited

U.S. PATENT DOCUMENTS

| | | | |
|---|---|---|---|
| 3,360,696 | 12/1967 | Neilson et al. | 357/39 |
| 3,727,116 | 4/1973 | Thomas et al. | 357/39 |
| 3,772,576 | 11/1973 | Nienhuis et al. | 357/34 |
| 3,911,473 | 10/1975 | Nienhuis | 357/52 |
| 3,971,061 | 7/1976 | Matsushita et al. | 357/38 |
| 4,066,483 | 1/1978 | D'Altroy et al. | 357/39 |

FOREIGN PATENT DOCUMENTS

| | | | |
|---|---|---|---|
| 2406431 | 8/1974 | Fed. Rep. of Germany | 357/39 |
| 1427014 | 3/1976 | United Kingdom | 357/39 |

*Primary Examiner*—Joseph E. Clawson, Jr.
*Attorney, Agent, or Firm*—Oblon, Fisher, Spivak, McClelland & Maier

[57] ABSTRACT

A semiconductor device including at least four zones of alternately opposite conductivity types, the two inner zones and the outer zone adjoining each of them in each case possessing a common surface, on which there is provided a main electrode making contact with both the inner and the outer zone, the first main electrode comprising a central recess in which the first inner zone is in contact with a control electrode, and there being on the surface of the two inner zones heavily doped regions, surrounding the two outer zones, of the same conductivity type as the adjoining inner zone and which are at a distance of at least two carrier-diffusion lengths for the purpose of forming a guard zone for the outer zone disposed on the same surface, and wherein there is provided on the surface of an inner zone, between the outer zone disposed on the same surface and the heavily doped region surrounding that outer zone, an annular guard zone of the opposite conductivity type to that of the adjacent inner zone.

9 Claims, 3 Drawing Figures

GATE-CONTROLLED REVERSE CONDUCTING THYRISTOR

BACKGROUND OF THE INVENTION

1. Field of the Invention

This invention relates to a four zone semiconductor device provided with guard zones to protect against reversal failure.

2. Description of the Prior Art

Such a semiconductor device is known for example from Swiss Patent No. 548,113. It constitutes a reverse-conducting thyristor, and consists essentially of a reverse cut-off thyristor with a diode in inverse parallel integrated in the same silicon wafer. As is implied by the name, such semiconductor devices have no cut-off capability in the reverse direction. In the forward direction, they function in the usual manner, that is to say they cut off the applied voltage until a firing pulse is applied via the control electrode. Such semiconductor devices are advantageously used for example in chopper circuits in electric drives (cf. for example IEEE Trans. Ind. Appl. IA-9 (1973), 236–247).

Semiconductor devices of the stated kind have the more particular advantage that the reverse current flows almost entirely via the integrated diode, and the device is accordingly capable of cutting off again more quickly upon transition to the forward cut-off condition.

However, a problem that arises with such semiconductor devices is that the charge-carriers present in the reverse conducting condition, which flow in the region of the integrated diode, exhibit a tendency to diffuse into the thyristor region upon transition to the forward cut-off condition (that is to say upon voltage reversal) and to cause the component to fire erroneously, with the result that in many cases the component is destroyed (known as reversal failure). Attempts have been made to counter this risk by providing a distance of at least two carrier-diffusion lengths between the emitting regions of the diode and of the thyristor for the purpose of forming a guard zone (Swiss Pat. No. 548,113), or by providing a channel in the protective zone between these regions (IEEE op. ct., FIG. 2). However, these measures have not proved to be sufficient.

SUMMARY OF THE INVENTION

Accordingly, it is the object of this invention to provide an improved, novel semiconductor device which is not subject to reversal failure.

This and other objects of the present invention are achieved by providing a semiconductor device including at least four zones of alternately opposite conductivity types, the two inner zones and the outer zone adjoining them having in each case a common surface on which there is a main electrode making contact with both the inner and the outer zone, the first main electrode comprising a central recess in which the first inner zone is in contact with a control electrode, and there being on the surface of the two inner zones heavily doped regions, surrounding the two outer zones, of the same conductivity type as the adjoining inner zone which are at a distance of at least two carrier-diffusion lengths L as herein defined for the purpose of forming a guard zone for the outer zone disposed on the same surface, and wherein there is provided on the surface of the first and/or second inner zone between the outer zone disposed on the same surface and the heavily doped region surrounding the outer zone an annular guard zone of the opposite conductivity type to that of the adjacent inner zone.

In this connection, in an especially preferred embodiment an annular guard zone is provided only in the second inner zone, its boundary nearer the center of the device is at a distance $d$ from the outer zone disposed on the opposite surface and its width is $r$, and both $d$ and $r$ are in each case at least equal to one carrier-diffusion length L and at most equal to three times the thickness B of the semiconductor body of the semiconductor component. In this case, the annular guard zone is directly adjacent to the heavily doped emitting region, disposed on the same side of the semiconductor device, of the integrated diode.

The annular guard zone substantially prevents the diode from parasitically injecting charge-carriers into the region of the guard zone with resultant erroneous firings and reversal failure in the thyristor portion, because when the forward cut-off voltage is applied to the thyristor fewer charge-carriers which could encourage undesired firing are present.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
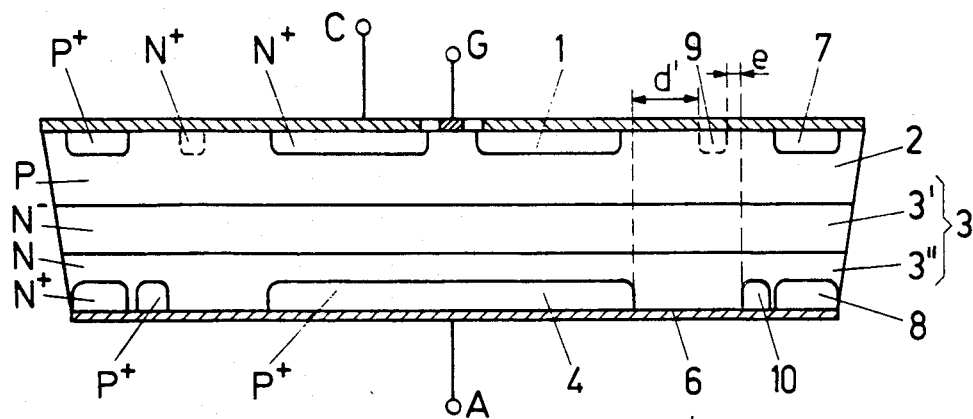
FIG. 1 is a cross-sectional view of one semiconductor device according to the invention.
Figure 2:
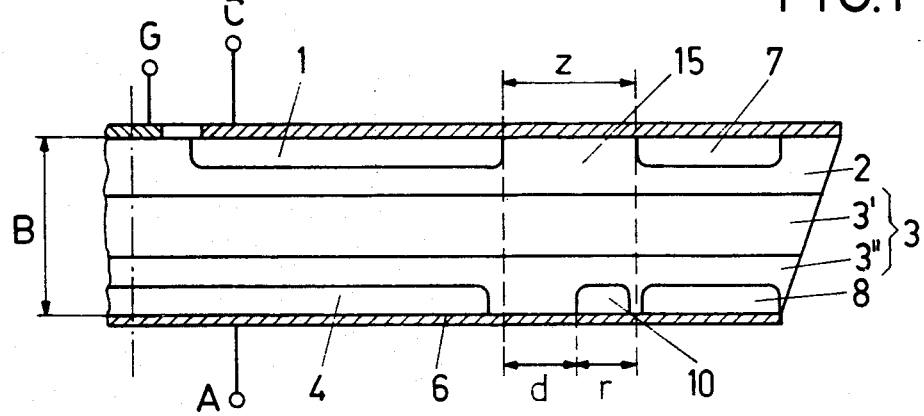
FIG. 2 is a cross-sectional view of part of a rotationally symmetrical semiconductor device according to the invention.
Figure 3:
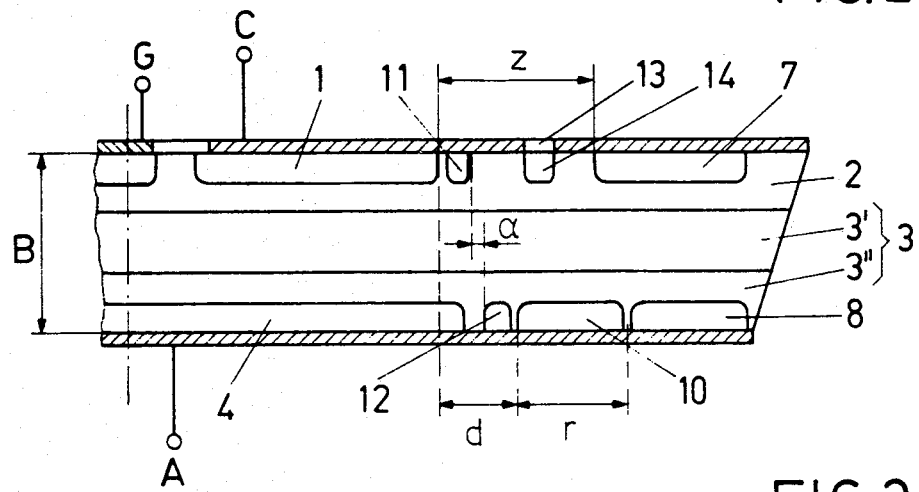
FIG. 3 is a cross-sectional view of part of another rotationally symmetrical semiconductor device according to the invention.

Referring now to the drawings, wherein like reference numerals designate identical or corresponding parts throughout the several views, the semiconductor devices illustrated in FIGS. 1 to 3, all comprise a first outer heavily n-doped zone 1, briefly called an n-emitter, a first inner p-doped zone 2, briefly called a p-control base, a second inner n-doped zone 3, briefly called an n-base, including a more lightly doped region 3' and a more heavily doped region 3'', and a second outer heavily p-doped zone 4, briefly called a p-emitter.

The semiconductor devices illustrated are metallised on their surfaces 5, 6 and provided with electrical connections, so that the cathode C, the anode A and the control electrode G result.

Furthermore, the semiconductor devices illustrated comprise on the cathode side a first heavily doped region 7 and on the anode side a second heavily doped region 8. Since both of the regions 7 and 8 are in contact with the electrode metallising of the cathode C and of the anode A respectively, the field between the regions 7 and 8 acts as an integrated diode connected in parallel with and in opposition to the thyristor formed by the zones 1, 2, 3, 4 which diode passes the current when there is a positive voltage on the cathode C and a negative voltage on the anode A, that is to say in the reverse biased condition of the device. In order that the charge-carriers flowing in this current may diffuse as little as possible into the thyristor portion 1, 2, 3, 4 the mutually opposed lateral boundaries of the emitters 1, 4 on the one hand and of the regions 7, 8 on the other hand disposed on the same side are separated by a distance z equal to at least two carrier-diffusion lengths L.

The carrier-diffusion length L is defined by the equation $L=\sqrt{D\cdot\tau}$ where D is the diffusion constant of the minority-carriers in the most lightly doped zone, that is to say in the regin 3' of the n-base, and $\tau$ is the carrier lifetime.

Now in FIG. 1 there is a first annular guard zone 9 on the cathode side, and a second annular guard zone 10 on the anode side. Fundamentally, there may in fact be either the annular guard zone 9 only or the annular guard zone 10 only, or both annular guard zones 9 and 10 may be present together. However, the embodiment with only one annular guard zone 10 on the anode side or only one annular guard zone 9 on the cathode side is to be preferred to the embodiment with both annular guard zones simultaneously present, since the component otherwise becomes too large. In practice, an annular guard zone on the anode side has proven to be advantageous. Accordingly, the annular guard zone 9 is shown only in broken line in FIG. 1. Simultaneous use of the annular guard zones 9 and 10 imparts an especially great width to the component because the two zones 9 and 10 must be offset with respect to one another by a distance e at least equal to one carrier-diffusion length L. Otherwise there is a resultant risk of parasitic firing of the thyristor system 9-2-3-10.

In any case however, the dimensions must be such that an annular protective zone 9 or 10, in orthogonal projection upon the surfaces 5, 6 is at a distance d or d' respectively from the nearest point of the emitter zone 4 or 1 respectively disposed on the opposite side, and furthermore has a width of r in which case both d, d' and also r is in each case at least equal to L, and at most equal to three times the thickness B of the semiconductor body of the semiconductor component.

The requirement for the distance d, d' is to ensure that parasitic firing of the thyristor system 4-3-2-9 or 1-2-3-10 is avoided. The requirement for thw width r is to ensure that the annular guard zones 9 and 10 reliably fulfil their protective function against switch-over faults.

The advantage of the annular guard zone in the protective zone 15 resides not only in the greater security against reversal failure, but also in the possibility of reducing the width z of the protective zone 15. This advantage is to a large extent lost in the simultaneous presence of both the guard zone 9 and the guard 10, due to the necessary mutual offset e so that as already mentioned above, the embodiment with only one guard zone 9 or 10 is to be preferred.

The embodiment preferred in practice, with only one annular guard zone 10 on the anode side, is illustrated in FIG. 2, in which the requirements as to dimensions given above apply. The width z of the protective zone 15 must amount to at least 2 carrier-diffusion lengths L as herein defined.

The last point naturally also applies to the embodiments according to FIGS. 1 and 3.

Besides the greater reliability upon voltage reversal and the reduction in the value of z, all the embodiments described yield the further advantage that the heavily doped regions 7, 8 need not be exactly aligned with respect to one another, i.e. need not coincide in orthogonal projection upon the surfaces 5, 6. This has an advantageous significance for the technical process of production. The unaligned regions 7, 8 are indicated in FIG. 3.

The embodiment according to FIG. 3 is a further modification of the embodiment according to FIG. 2. The device illustrated in FIG. 3 additionally comprises, as compared to the device illustrated in FIG. 2, a heavily doped region 11 and 12 in each case of the same conductivity type as the inner zone 2 or 3 respectively in which the regions are embedded. Thus the region 11 is p-doped and the region 12 is n-doped. The regions 11 and 12 act as short-circuiting rings, and help to prevent firing by lateral currents such as those encountered for example when there is a very steep increase in voltage dv/dt. The short-circuiting rings 11, 12 are laterally offset by the distance a, because together they constitute a parasitic diode which may only pass a small current density when conducting. The distance a is typically between L and 2B.

A further improvement in the decoupling of the diode and thyristor portions, and thus an increase in the security against voltage reversal failure, may be attained by an interruption 13 in the electrode metallising and/or a channel 14 on the surface of the semiconductor body.

These features in which the embodiment according to FIG. 3 differs from the embodiment according to FIG. 2 are also illustrated in FIG. 3.

Semiconductor devices according to the invention have already been tested with great success in rectifiers and interruption-free power supply systems. The devices tested correspond to the embodiment of FIG. 3 but without the features 13 and 14. In these devices the dimensions were $r=0.1-1$ mm, $d=0.1-1$mm, $z=r+d=0.2-2$mm, $a=0.05-0.5$ mm. The width of the regions 11, 12 was 0.02-0.2 mm.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A gate-controlled reverse conducting thyristor including a semiconductor body of at least four zones of alternately opposite conductivity types, the first and second inner zones and the respective outer zone adjoining each of said inner zones in each case having a common surface on which there is a main electrode making contact with one of said inner zones and its adjoining outer zone, the first main electrode comprising a central recess in which said first inner zone is in contact with a control electrode, wherein;

the surfaces of said two inner zones contain first heavily doped regions disposed thereon surrounding said adjoining outer zones and separated from said adjoining outer zones by a distance of at least two carrier diffusion lengths, said first heavily doped regions being of the same conductivity type as that of said inner zones and forming guard zones for each of said adjoining outer zones disposed on the same surface, said first heavily doped regions forming an integrated inverse diode in parallel with said tyristor; and, said surfaces of said two inner zones also contain second highly doped regions disposed thereon between the outer zone disposed on the same surface and said first heavily doped regions surrounding said outer zone and forming an annular guard zone of the opposite conductivity type to that of the adjoining inner zone;

whereby said annular guard zone prevents parasitic charge carrier injection into the regions of the annular guard zone and thereby protects against reversal failure of the thyristor upon transition to a forward biased cut-off condition.

2. A gate-controlled reverse conducting thyristor including a semiconductor body of at least four zones of alternately opposite conductivity types, the first and second inner zones and the respective outer zone adjoining each of said inner zones in each case having a common surface on which there is a main electrode making contact with one of said inner zones and its adjoining outer zone, the first main electrode comprising a central recess in which said first inner zone is in contact with a control electrode, wherein:

the surfaces of said two inner zones contain first heavily doped regions disposed thereon surrounding said adjoining outer zones and separated from said adjoining outer zones by a distance of at least two carrier diffusion lengths, said first heavily doped regions being of the same conductivity type as that of said inner zones and forming guard zones for each of said adjoining outer zones disposed on the same surface, said first heavily doped regions forming an integrated inverse diode in parallel with said thyristor;

said surface of said second inner zone also contains a second highly doped region disposed thereon surrounding said outer zone adjoining said surface and forming an annular guard zone of the opposite conductivity to that of said second inner zone; and, said annular guard zone is disposed towards the center of said device, considered in perpendicular projection upon said surfaces being at a distance d from the outer zone disposed on the opposite surface and its width being r, both d and r being at least equal to one carrier-diffusion length L and at most equal to three times the thickness B of the semiconductor body of the thyristor;

whereby said annular guard zone prevents parasitic charge carrier injection into the region of said annular guard zone and thereby protects against reversal failure of said thyristor upon transition to a forward biased cut-off condition.

3. A gate-controlled reverse conducting thyristor according to claim 1, wherein:

the orthogonal projections upon the surfaces of the thyristor of said second heavily doped regions forming said annular guard zone do not coincide.

4. A gate-controlled reverse conducting thyristor according to claim 1, wherein:

said annular guard zones provided in said first and second zones, are mutually offset in their orthogonal projections upon the surfaces of the device by a distance e of at least one carrier-diffusion length L, and the annular guard zone which is more offset towards the center of said semiconductor devices is in orthogonal projection upon the device surfaces at a distance d' from the opposite outer zone and both annular guard zones have a width r, both d' and r being in each case at least equal to one carrier-diffusion length L and at most equal to three times the thickness B of the semiconductor body of said thyristor.

5. A gate-controlled reverse conducting thyristor according to claim 2, wherein:

said surface of said first and second inner zones between said outer zone disposed on the same surface and said annular guard zone contains third heavily doped regions of the same conductivity type as that of the adjoining inner zone.

6. A gate-controlled reverse conducting thyristor according to claim 5, wherein:

said third heavily doped regions are mutually offset in such a manner that in orthogonal projection upon the thyristor surfaces the adjacent boundaries of the said third heavily doped regions are separated by a distance a of more than the carrier diffusion length L and less than twice the thickness B of the semiconductor body of the thyristor.

7. A gate-controlled reverse conducting thyristor according to claim 2, wherein said main electrode, at least on one side of said thyristor, comprises:

a metallized layer with an interruption thereon.

8. A gate-controlled reverse conducting thyristor according to claim 2 wherein:

said surface of said first inner zone is channelized anywhere between the outer zone and said first heavily doped regions disposed on the same surface as said first inner zone, but not in the field of said annular guard zone, said channelization surrounding said first outer zone.

9. A gate-controlled reverse conducting thyristor according to claim 7 wherein:

said surface of said first inner zone is channelized anywhere between the outer zone and the first heavily doped region disposed on the same surface as said first inner zone but not in the field of said annular guard zone, said channelization surrounding said first outer zone.

* * * * *